United States Patent
Ito et al.

(10) Patent No.: US 8,293,448 B2
(45) Date of Patent: Oct. 23, 2012

(54) RESIN COMPOSITION FOR STEREOLITHOGRAPHY

(75) Inventors: Takashi Ito, Yokohama (JP); Tsuneo Hagiwara, Yokohama (JP); Kenji Hirotsu, Ube (JP); Tadashi Murakami, Ube (JP)

(73) Assignees: CMET Inc., Yokohama-Shi, Kanagawa (JP); Ube Industries, Ltd., Ube-Shi, Yamaguchi (JP)

( * ) Notice: Subject to any disclaimer, the term of this patent is extended or adjusted under 35 U.S.C. 154(b) by 206 days.

(21) Appl. No.: 12/304,962

(22) PCT Filed: Jun. 15, 2007

(86) PCT No.: PCT/JP2007/062085
§ 371 (c)(1),
(2), (4) Date: Mar. 30, 2009

(87) PCT Pub. No.: WO2007/145309
PCT Pub. Date: Dec. 21, 2007

(65) Prior Publication Data
US 2009/0209674 A1    Aug. 20, 2009

(30) Foreign Application Priority Data
Jun. 16, 2006 (JP) .................... 2006-166853

(51) Int. Cl.
*G03C 9/00* (2006.01)
*G03C 5/00* (2006.01)
*G03F 7/00* (2006.01)

(52) U.S. Cl. .............. 430/269; 522/15; 522/168

(58) Field of Classification Search .......... 430/269; 522/168, 170, 15
See application file for complete search history.

(56) References Cited

U.S. PATENT DOCUMENTS

| 7,183,040 B2 * | 2/2007 | Thies et al. ............. 430/280.1 |
| 7,354,643 B2 * | 4/2008 | Ito et al. ................. 428/327 |
| 2007/0060682 A1 | 3/2007 | Ito et al. |
| 2008/0064780 A1 * | 3/2008 | Thies et al. ............. 522/25 |
| 2010/0104804 A1 * | 4/2010 | Ito et al. ............... 428/141 |

FOREIGN PATENT DOCUMENTS

| JP | 7-103218 B2 | 11/1995 |
| JP | 11-199647 A | 7/1999 |
| JP | 2000-302774 A | 10/2000 |
| JP | 2001-181385 A | 7/2001 |
| JP | 2004-51556 A | 2/2004 |
| JP | 2005-15739 A | 1/2005 |
| WO | WO-01/22165 A1 | 3/2001 |
| WO | WO-2004/113396 A1 | 12/2004 |
| WO | WO-2007/037434 A1 | 4/2007 |

OTHER PUBLICATIONS

Paul F. Jacobs, "Rapid Prototyping and Manufacturing, Fundamentals of Stereo-Lithography," Society of Manufacturing Engineers, 1992, p. 25-58.

* cited by examiner

*Primary Examiner* — Susan W Berman
(74) *Attorney, Agent, or Firm* — Birch, Stewart, Kolasch & Birch, LLP

(57) ABSTRACT

Provided is a resin composition for stereolithography that absorbs little water and moisture over time in uncured state, maintains a low moisture absorption rate even under high humidity, and has high curing sensitivity, from which a stereolithography product excellent in the properties, such as dimensional accuracy, mechanical properties, and dimensional stability can be smoothly produced for reduced light irradiation time. The resin composition for stereolithography comprising an oxetane compound expressed by the general formula (I) below:

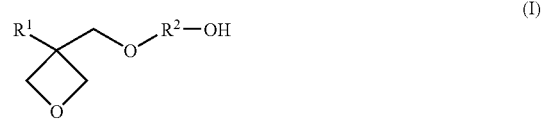

wherein $R^1$ denotes an alkyl group having 1 to 5 carbon atoms, and $R^2$ denotes an alkylene group having 2 to 10 carbon atoms that may contain an ether bond, in the proportion of from 3 to 60 mass % based on the total mass of the resin composition for stereolithography.

4 Claims, No Drawings

RESIN COMPOSITION FOR STEREOLITHOGRAPHY

TECHNICAL FIELD

The present invention relates to a resin composition for stereolithography. More specifically, the present invention relates to a resin composition for stereolithography that absorbs little water and moisture over time before curing, has stable physical properties, can be controlled easily and smoothly in curing reaction during fabrication, and has high curing sensitivity for active energy rays, and from which a 3-dimensional article excellent in fabrication accuracy, dimensional accuracy, water resistance, moisture resistance, and mechanical properties (particularly toughness) can be produced smoothly and productively for reduced fabrication time.

BACKGROUND ART

In recent years, methods for stereolithography using liquid photocuring resin compositions based on data inputted with three-dimensional CAD have been widely employed because intended 3-dimensional article can be produced in good dimensional accuracy without fabricating a die assembly and the like.

A typical example of stereolithography may include a method in which ultraviolet laser controlled by a computer so as to obtain a desired pattern is selectively radiated to a liquid surface of a liquid photocuring resin placed in a container to cure through a predetermined thickness, followed by supplying the liquid resin for one layer onto the cured layer and radiating ultraviolet laser for curing similarly as above, and thus laminating operation for obtaining subsequent cured layers is repeated, and thereby a 3-dimensional article is finally obtained. Such method of stereolithography enables to easily obtain a 3-dimensional article even in a fairly complex form for a relatively short time period.

Still in recent years, instead of the conventional methods described above using spot ultraviolet laser light, stereolithography techniques have been proposed that sequentially form photocured resin layers having a predetermined sectional form pattern by radiating light to a liquid surface of a photocuring resin through a liquid crystal paint mask having a large number of liquid crystal microshutters capable of shading and transmitting light in microdot area and disposed in a sheet-like form, or a sheet-like print mask made of so-called DMD (digital micromirror device) having a plurality of digital micromirror shutters disposed in a sheet-like form between a light source and a surface of a photocuring resin composition. Since the stereolithography techniques using a print mask can radiate light to a fabrication surface made of a photocuring resin composition in a sheet-like form at one time to form a photocured sectional form pattern in a sheet-like form at one time, they can remarkably improve the stereolithography speed compared with a stippling system using spot ultraviolet laser.

Various properties are required for resin compositions used for stereolithography, such as good handling property during fabrication due to low viscosity, stable physical and curing properties due to less absorption of water and moisture over time before curing the resin compositions, high curing sensitivity for active energy rays, good curing properties in an oxygen atmosphere, excellent fabrication accuracy with high resolution of 3-dimensional article thereof, a low volume shrinkage after curing, excellent mechanical properties of cured products thereof, and excellent dimensional stability for less water and moisture absorption over time due to excellent water resistance and moisture resistance of cured products thereof.

As a resin composition for stereolithography, acrylate photocuring resin compositions, urethane acrylate photocuring resin compositions, epoxy photocuring resin compositions, epoxy acrylate photocuring resin compositions, and vinyl ether photocuring resin compositions have been conventionally proposed and employed. Among these, epoxy photocuring resin compositions in particular have attracted attention recently because of the good dimensional accuracy of fabricated products obtained therefrom.

Such epoxy photocuring resin compositions, however, are pointed out that the reaction speed is slow because reaction proceeds with cations generated by light irradiation, and thus fabrication takes too much time. Under such circumstances, to increase the reaction speed, such epoxy photocuring resin compositions are proposed to be added with low molecular weight polyol compounds, such as ethylene glycol and propylene glycol. Moreover, for the purpose of reduction in fabrication time by improving the reaction speed, a resin composition for stereolithography is proposed in which a polyester polyol compound is added to a photocuring resin composition including a cationically polymerizable organic compound, such as epoxy compounds, and a radical polymerizable organic compound (Patent Document 1). In either case however, since the curing speed during photocuring is slow, stereolithography takes time and fabricated products thus obtained are not cured sufficiently and does not have sufficient mechanical properties. Furthermore, fabricated products thus obtained have low dimensional accuracy, and also have problems in water resistance and moisture resistance.

With these points in mind, the present inventors kept on conducting researches with an object to provide a resin composition for stereolithography which has high curing sensitivity for active energy rays to be able to produce a 3-dimensional article productively for reduced active energy ray irradiation time; which is excellent in resolution and fabrication accuracy to be able to produce a fabricated product with intended dimensions; a cured product of which has a low volume shrinkage after curing thus having high dimensional accuracy and has excellent water resistance and moisture resistance, absorbing less water and moisture over time, and is excellent in dimensional stability, and still further excellent in mechanical properties. Then, they found that, in a case where oxetane monoalcohol expressed by the general formula (II) below;

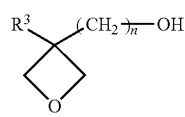

(II)

(wherein $R^3$ denotes an alkyl group, an aryl group, or an aralkyl group, and n denotes an integer from 1 to 6) is contained in a resin composition for stereolithography, when fabricated using a resin composition for stereolithography obtained thereby, a 3-dimensional article that is excellent in water resistance and moisture resistance, and moreover, is excellent in dimensional accuracy, dimensional stability, and mechanical properties can be productively produced at high reaction speed and high fabricating speed for reduced active energy ray irradiation time, and applied for patent in advance (Patent Document 2).

The present inventors have further continued studies regarding the resin composition for stereolithography of Patent Document 2 and the physical properties of a 3-dimensional article obtained therefrom. As a result, it was found that, to produce a 3-dimensional article for shorter time by smoothly controlling the fabrication time, the water and moisture absorption over time before curing the resin composition for stereolithography has to be further less.

[Patent Document 1] Japanese Examined Patent Publication No. H07-103218
[Patent Document 2] Japanese Unexamined Patent Publication No. H11-199647
[Non-Patent Document 1] Paul F. Jacobs, "Rapid Prototyping & Manufacturing, Fundamentals of Stereo-Lithography", "Society of Manufacturing Engineers", 1992, p. 28-39.

DISCLOSURE OF THE INVENTION

Problems to be Solved by the Invention

An object of the present invention is to provide a resin composition for stereolithography that absorbs less water and moisture over time before curing the resin composition, can maintain a low moisture absorption rate even when kept under high humidity, is excellent in handling due to stable physical and curing properties, has high curing sensitivity, from which a 3-dimensional article can be produced productively for reduced active energy ray irradiation time.

Further, another object of the present invention is to provide a resin composition for stereolithography, together with the properties above, from which a fabricated product having intended dimensions can be produced with high resolution and fabrication accuracy when fabricated by active energy ray irradiation, and moreover, from which a 3-dimensional article can be produced that has a low volume shrinkage after curing, absorbs less water and moisture after curing, and is excellent in dimensional stability, and also, excellent in mechanical properties.

Means for Solving the Problems

The present inventors keenly made thorough investigation to solve the problems above. As a result, they found that in a case where an oxetane compound expressed by the general formula (I) below;

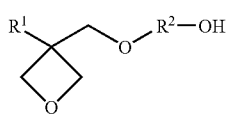

(I)

(wherein $R^1$ denotes an alkyl group having 1 to 5 carbon atoms and $R^2$ denotes an alkylene group having 2 to 10 carbon atoms that may contain an ether bond) is formulated to be contained in the proportion of from 3 to 60 mass % in the resin composition for stereolithography, a resin composition for stereolithography can be obtained that absorbs extremely little water and moisture over time before curing the resin composition so that a low moisture absorption rate can be maintained even when kept under high humidity, and has stable physical and curing properties and excellent handling properties.

The present inventors further found that the resin composition for stereolithography containing an oxetane compound expressed by the general formula (I) above has high curing sensitivity for active energy rays and thus a 3-dimensional article thereof can be produced productively for reduced active energy ray irradiation time, that the resin composition is excellent in resolution and fabrication accuracy and thus a 3-dimensional article thereof can be obtained with intended dimensions, that the 3-dimensional article has a low volume shrinkage after curing and thus the dimensional accuracy is high, that the 3-dimensional article has low moisture absorption even after curing and thus a cured product thereof is good in dimensional stability, and moreover, that such cured product thereof is excellent in mechanical properties, particularly toughness, and thus it is not easily broken even when external stress, such as flexure and impact, are applied.

The present inventors also found that other cationically polymerizable organic compounds, particularly epoxy compounds and oxetane compounds other than the oxetane compound expressed by the general formula (I) above, can be contained in the resin composition for stereolithography containing an oxetane compound expressed by the general formula (I), and that radical polymerizable organic compounds can be further contained in the resin composition for stereolithography containing the substances above, and thereby curing sensitivity, resolution, fabrication accuracy, and dimensional accuracy of the resin composition for stereolithography and mechanical properties of a cured product thereof are further improved, and moreover, volume shrinkage after curing, moisture absorption, and the like can be further reduced, and completed the present invention based on such various findings.

In other words, the present invention is:
(1) a resin composition for stereolithography, comprising an oxetane compound expressed by the general formula (I) below;

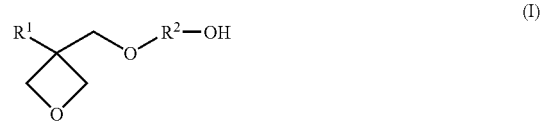

(I)

(wherein $R^1$ denotes an alkyl group having 1 to 5 carbon atoms, and $R^2$ denotes an alkylene group having 2 to 10 carbon atoms that may contain an ether bond) in the proportion of from 3 to 60 mass % based on the total mass of the resin composition for stereolithography.

In addition, the present invention is:
(2) the resin composition for stereolithography of (1) above, comprising the oxetane compound expressed by the general formula (I) above, a cationically polymerizable organic compound other than the oxetane compound expressed by the general formula (I) above, and an active energy ray sensitive cationic polymerization initiator; and
(3) the resin composition for stereolithography of (1) or (2) above, comprising the oxetane compound expressed by the general formula (I) above, a cationically polymerizable organic compound other than the oxetane compound expressed by the general formula (I) above, a radical polymerizable organic compound, an active energy ray sensitive cationic polymerization initiator, and an active energy ray sensitive radical polymerization initiator; and
(4) the resin composition for stereolithography of (3) above, wherein, based on the total mass of the resin composition for stereolithography, a content of the oxetane compound expressed by the general formula (I) above is from 3 to 60 mass %, a content of the cationically polymerizable organic compound other than the oxetane compound expressed by the general formula (I) above is from 20 to 70 mass %, a content of the radical polymerizable organic compound is from 5 to 50 mass %, a content of the active energy ray sensitive cationic polymerization initiator is from 1 to 10 mass %, and a content of the active energy ray sensitive radical polymerization initiator is from 1 to 10 mass %.

Further, the present invention is:
(5) the resin composition for stereolithography of any of (2) through (4) above, wherein the cationically polymerizable organic compound other than the oxetane compound expressed by the general formula (I) above includes an epoxy compound;
(6) the resin composition for stereolithography of any of (3) through (5) above, wherein the radical polymerizable organic compound includes an ethylenic unsaturated compound; and
(7) the resin composition for stereolithography of any of (1) through (6) above, comprising an oxetane compound other than the oxetane compound expressed by the general formula (I) above.

Effects of the Invention

The resin composition for stereolithography of the present invention absorbs extremely little water and moisture over time in uncured state, can maintain a low moisture absorption rate even when kept under high humidity, has stable physical and curing properties, and is excellent in handling property.

The resin composition for stereolithography of the present invention has high curing sensitivity for active energy rays and thus a 3-dimensional article thereof can be produced productively for reduced active energy ray irradiation time, and moreover, the resin composition is excellent in resolution and fabrication accuracy so that a fabricated product thereof can be obtained with intended dimensions.

Further, a 3-dimensional article obtained from the resin composition for stereolithography of the present invention has a low volume shrinkage after curing and thus the dimensional accuracy is high, the product has low moisture absorption and thus the dimensional stability is good, and moreover, the product has excellent mechanical properties, particularly toughness, and thus it is not easily broken even external stress, such as impact and flexure, is applied.

In particular, among the resin compositions for stereolithography of the present invention, the resin composition for stereolithography containing, together with the oxetane compound expressed by the general formula (I) above, another cationically polymerizable organic compound, a radical polymerizable organic compound, an active energy ray sensitive cationic polymerization initiator, and an active energy ray sensitive radical polymerization initiator, and a 3-dimensional article obtained therefrom are further excellent in the properties mentioned above, such as low moisture absorption, curing sensitivity, resolution, fabrication accuracy, and dimensional accuracy, and mechanical properties in the cured product.

BEST MODE FOR CARRYING OUT THE INVENTION

Hereinafter, the present invention is described in detail. It should be noted that in the present description "under high humidity" means an environment in which not less than 20° C. of temperature and not less than 80% of relative humidity are measured, using the relative humidity (unit: %), as an index, obtained by dividing the amount (specific humidity) of water vapor contained in the atmosphere at a predetermined temperature by the amount (specific humidity) of saturated water vapor at the temperature.

A resin composition for stereolithography of the present invention contains an oxetane compound expressed by the general formula (I) below [hereinafter referred to as "oxetane compound (I)"];

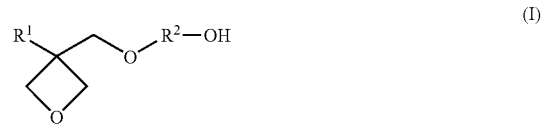

(I)

(wherein $R^1$ denotes an alkyl group having 1 to 5 carbon atoms, and $R^2$ denotes an alkylene group having 2 to 10 carbon atoms that may contain an ether bond) in the proportion of from 3 to 60 mass % based on the total mass of the resin composition for stereolithography.

Since the resin composition for stereolithography of the present invention contains oxetane compound (I) in the above proportion of from 3 to 60 mass %, the resin composition before curing absorbs extremely little water and moisture over time, and even when kept under high humidity, it also has a low rate of moisture content (water absorption rate) and maintains high curing sensitivity. Using such resin composition for stereolithography of the present invention having an extremely low moisture content (moisture absorption rate) enables to productively produce a 3-dimensional article having a low volume shrinkage after curing, excellent dimensional accuracy, low moisture absorption, good dimensional stability, and excellent mechanical properties with high resolution and fabrication accuracy for reduced fabrication time.

In a case of oxetane compound (I) contained more than the range above, the resin composition for stereolithography absorbs more water and moisture over time, while in a case of a content less than the range above, reactivity during light irradiation becomes low and fabrication speed is reduced.

The content of oxetane compound (I) is preferably from 5 to 40 mass % based on the total mass of the resin composition for stereolithography.

In oxetane compound (I) expressed by the general formula (I) above, $R^1$ may be either a straight chain or branched alkyl group as long as the alkyl group has 1 to 5 carbon atoms. Specific examples of $R^1$ may include methyl group, ethyl group, n-propyl group, isopropyl group, n-butyl group, t-butyl group, sec-butyl group, n-pentyl group, and isopentyl group. Among these, $R^1$ is preferably a methyl group or an ethyl group from the perspective such as the availability of synthetic materials.

Still in oxetane compound (I), $R^2$ may be either a straight chain or branched alkylene group as long as the alkylene group has 2 to 10 carbon atoms, or alternatively may be a straight chain or branched alkylene group having 2 to 10 carbon atoms containing an ether bond (ether oxygen atom) within the alkylene group (alkylene chain).

Specific examples of $R^2$ may include ethylene group, trimethylene group, tetramethylene group, pentamethylene group, hexamethylene group, and 3-oxypentylene group.

Among these, $R^2$ is preferably a trimethylene group, a tetramethylene group, a pentamethylene group, or a heptamethylene group from the perspective such as the ease of synthesis and the easy handling of the compounds thereof, which are liquid at ordinary temperature.

The method of producing oxetane compound (I) used in the present invention is not particularly limited.

Oxetane compound (I) may be produced by, for example, synthetic routes A and B shown below

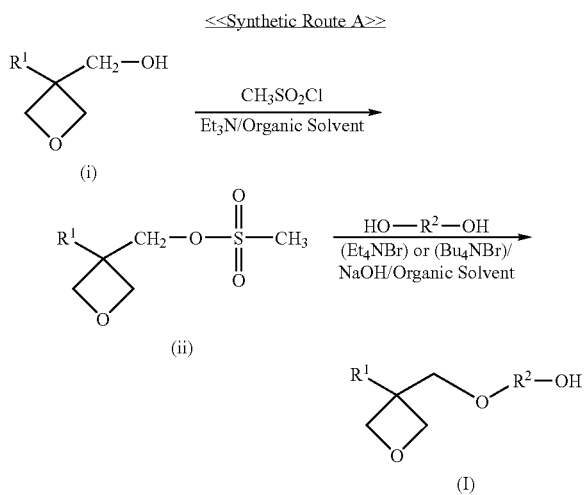

(wherein $R^1$ and $R^2$ denote the same groups as above)

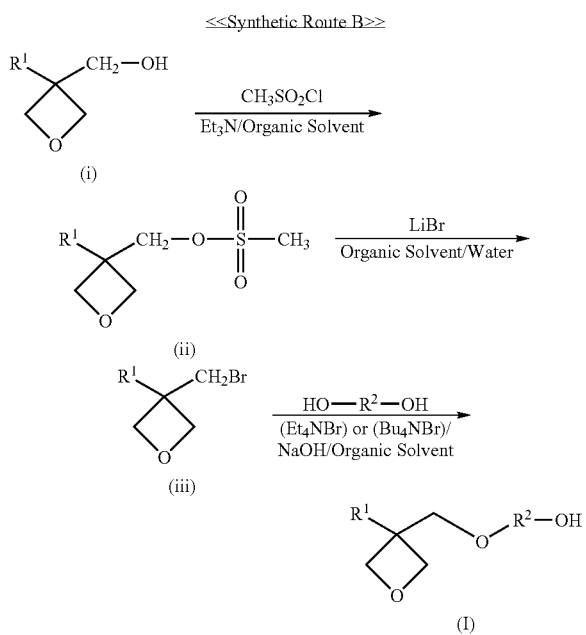

(wherein $R^1$ and $R^2$ denote the same groups as above)

In the synthetic routes A and B above, when producing an oxetane compound expressed by the general formula (ii) by reacting the oxetane compound expressed by the general formula (i) above with methanesulfonyl chloride ($CH_3SO_2Cl$) in the presence of triethylamine ($Et_3N$), the reaction is preferably carried out by using triethylamine in the proportion from 0.9 to 1.5 mol and methanesulfonyl chloride in the proportion from 1.0 to 2.0 mol relative to 1 mol of the oxetane compound expressed by the general formula (i) while keeping the liquid temperature within the range from 5° C. to 10° C. During the reaction, the synthesis reaction of the oxetane compound expressed by the general formula (ii) is preferably carried out in an organic solvent (for example, aromatic hydrocarbons such as toluene and xylene).

Then, in the synthetic route A, oxetane compound (I) is preferably synthesized by using, relative to 1 mol of the oxetane compound expressed by the general formula (ii) generated as above, tetraethylammonium bromide ($Et_4NBr$) or tetrabutylammonium bromide ($Bu_4NBr$) in the proportion of from 0 to 0.1 mol and sodium hydroxide from 0.9 to 2.0 mol and further using diol expressed by a general formula: HO—$R^2$—OH in the proportion of from 1.5 to 8.0 mol, and by carrying out a reaction at temperatures from 50° C. to 150° C. Such reaction is preferably carried out in an organic solvent such as toluene.

In addition, in the synthetic route B, the oxetane compound expressed by the general formula (iii) is preferably produced by using lithium bromide in the proportion of from 1.0 to 1.5 mol relative to 1 mol of the oxetane compound expressed by the general formula (ii) generated as above, and carrying out a reaction at temperatures from 50° C. to 100° C. Such reaction is preferably carried out in a two phase system of an organic solvent (aromatic hydrocarbons such as toluene and xylene) and water. Then, oxetane compound (I) is preferably produced by using, relative to 1 mol of the oxetane compound expressed by the general formula (iii) thereby obtained, tetraethylammonium bromide ($Et_4NBr$) or tetrabutylammonium bromide ($Bu_4NBr$) in the proportion of from 0 to 0.1 mol, sodium hydroxide from 0.9 to 2.0 mol, and diol expressed by a general formula: HO—$R^2$—OH from 1.5 to 8.0 mol, and carrying out a reaction at temperatures from 30° C. to 150° C. Such reaction is preferably carried out in an organic solvent (for example, aromatic hydrocarbons such as toluene and xylene).

Since oxetane compound (I) develops a polymerization reaction and/or a crosslinking reaction when active energy rays are radiated in the presence of an active energy ray sensitive cationic polymerization initiator (hereinafter may simply be referred to as "a cationic polymerization initiator"), the resin composition for stereolithography of the present invention is formulated to contain a cationic polymerization initiator together with oxetane compound (I).

It should be noted that "active energy ray" in the present description is defined as an energy ray capable of curing resin compositions for stereolithography, such as ultraviolet rays, electron rays, X-rays, radioactive rays, and high frequency waves.

The resin composition for stereolithography of the present invention may be any resin composition for stereolithography as long as it contains oxetane compound (I) in the proportion of from 3 to 60 mass % and contains a cationic polymerization initiator, and is not particularly limited in type and content of other components, and thus allowed to use other components by selecting and combining according to the type and use of the fabricated product to be produced.

Among all, the resin composition for stereolithography of the present invention preferably contains oxetane compound (I), a cationically polymerizable organic compound other than oxetane compound (I), and a cationic polymerization initiator, and more preferably contains oxetane compound (I), a cationically polymerizable organic compound other than oxetane compound (I), a radical polymerizable organic compound, a cationic polymerization initiator, and an active energy ray sensitive radical polymerization initiator (hereinafter may be simply referred to as "a radical polymerization initiator"), and by formulating such composition, the water and moisture absorption over time of the resin composition for stereolithography before curing can be suppressed to a low level, and the properties such as curing sensitivity, resolution, and fabrication accuracy become better, and further obtained 3-dimensional article have better dimensional stability, mechanical properties, and the like.

In the abovementioned resin composition for stereolithography of the present invention, any compound other than oxetane compound (I) that develops polymerization reaction and/or crosslinking reaction when active energy rays are radiated in the presence of a cationic polymerization initiator may be used for the cationically polymerizable organic compound other than oxetane compound (I), typically as an epoxy compound, a cyclic ether compound other than oxetane compound (I), a cyclic acetal compound, a cyclic lactone compound, a cyclic thioether compound, a spiro orthoester compound, and a vinyl ether compound. In the present invention, one or not less than two types of the cationically polymerizable organic compounds mentioned above may be used.

More specifically, examples of such cationically polymerizable organic compound may include:

(1) epoxy compounds such as alicyclic epoxy resin, aliphatic epoxy resin, and aromatic epoxy resin;
(2) cyclic ether or cyclic acetal compounds, such as an oxetane compound, an oxolane compound such as tetrahydrofuran and 2,3-dimethyltetrahydrofuran, trioxane, 1,3-dioxolane, and 1,3,6-trioxanecyclooctane;
(3) cyclic lactone compounds such as β-propiolactone and s-caprolactone;
(4) thiirane compounds such as ethylene sulfide and thioepichlorohydrin;
(5) thietane compounds such as 1,3-propyne sulfide, 3,3-dimethylthietane;
(6) vinyl ether compounds such as ethylene glycol divinyl ether, alkyl vinyl ether, 3,4-dihydropyran-2-methyl (3,4-dihydropyran-2-carboxylate), and triethylene glycol divinyl ether;
(7) spiro orthoester compounds obtained by reaction of an epoxy compound and lactone; and
(8) ethylenically unsaturated compounds such as vinyl cyclohexane, isobutylene, and polybutadiene.

Among these, in the present invention, epoxy compounds are preferably used for the cationically polymerizable organic compound other than oxetane compound (I), and particularly polyepoxy compounds are more preferably used which have two or more epoxy groups in one molecule.

Such epoxy compounds that are preferably used as a cationically polymerizable organic compound may include alicyclic epoxy compounds, aliphatic epoxy compounds, and aromatic epoxy compounds.

The alicyclic epoxy compounds may include alicyclic diglycidyl ether compounds expressed by the general formula (III) below;

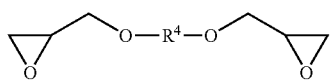

(III)

(wherein, $R^4$ denotes a hydrogenated bisphenol A residue, a hydrogenated bisphenol F residue, a hydrogenated bisphenol Z residue, a cyclohexane dimethanol residue, or a tricyclodecane dimethanol residue), polyglycidyl ethers of polyols which have at least one alicyclic ring, and cyclohexene oxide or cyclopentene oxide moiety containing compounds obtained by epoxidation of cyclohexene ring or cyclopentene ring containing compounds with an appropriate oxidant such as hydrogen peroxide and peracid.

More specifically, such alicyclic diglycidyl ether compounds expressed by the general formula (III) above may include, for example, hydrogenated bisphenol A diglycidyl ether, hydrogenated bisphenol F diglycidyl ether, hydrogenated bisphenol Z diglycidyl ether, cyclohexanedimethanol diglycidyl ether, and tricyclodecanedimethanol diglycidyl ether. In addition, other alicyclic epoxy resins may include, for example, 3,4-epoxycyclohexylmethyl-3',4'-epoxycyclohexane carboxylate, 2-(3,4-epoxycyclohexyl-5,5-spiro-3,4-epoxy)cyclohexane-meta-dioxane, bis(3,4-epoxycyclohexylmethyl)adipate, vinylcyclohexene dioxide, 4-vinylepoxycyclohexane, bis(3,4-epoxy-6-methylcyclohexylmethyl)adipate, 3,4-epoxy-6-methylcyclohexyl-3,4-epoxy-6-methylcyclohexane carboxylate, methylenebis(3,4-epoxycyclohexane), dicyclopentadiene diepoxide, di(3,4-epoxycyclohexylmethyl)ether of ethylene glycol, ethylenebis(3,4-epoxycyclohexane carboxylate), dioctyl epoxyhexahydrophthalate, and di-2-ethylhexyl epoxyhexahydrophthalate.

In addition, the abovementioned aliphatic epoxy compounds may include, for example, polyglycidyl ether of aliphatic polyol or an alkylene oxide adduct thereof, and polyglycidyl ester of aliphatic long chain polybasic acid. More specifically, they may include, for example, diglycidyl ether of 1,4-butanediol, diglycidyl ether of 1,6-hexanediol, triglycidyl ether of glycerol, triglycidyl ether of trimethylolpropane, tetraglycidyl ether of sorbitol, hexaglycidyl ether of dipentaerythritol, diglycidyl ether of polyethylene glycol, diglycidyl ether of polypropylene glycol, polyglycidyl ether of polyether polyol obtained by adding one or not less than two types of alkylene oxide to aliphatic polyol, such as ethylene glycol, propylene glycol, and glycerol, and diglycidyl ester of aliphatic long chain dibasic acid. They may further include other than the abovementioned epoxy compounds, for example, monoglycidyl ether of aliphatic higher alcohol, glycidyl ester of higher fatty acid, epoxidized soybean oil, butyl epoxy stearate, octyl epoxy stearate, epoxidized linseed oil, and epoxidized polybutadiene.

In addition, the abovementioned aromatic epoxy compounds may include, for example, mono- or poly-glycidyl ether of mono- or poly-phenol with at least one aromatic nucleus or an alkylene oxide adduct thereof, and more specifically, they may include, for example, glycidyl ether obtained by reaction of epichlorohydrin with bisphenol A, bisphenol F, or an alkylene oxide adduct thereof, epoxy novolac resin, and monoglycidyl ether of phenol, cresol, butyl phenol, or polyether alcohol obtained by adding alkylene oxide to these.

In the present invention, one or not less than two types of alicyclic epoxy compounds, aliphatic epoxy compounds, and aromatic epoxy compounds above may be used for the other cationically polymerizable organic compound other than oxetane compound (I).

Moreover, in the resin composition for stereolithography of the present invention, oxetane compounds other than oxetane compound (I) are also preferably used for the other cationically polymerizable organic compound used together with oxetane compound (I), and in this case, the water and moisture absorption over time of the resin composition for stereolithography before curing can be further reduced. The other oxetane compound may be either a monooxetane compound having one oxetane ring or a polyoxetane compound having two or more oxetane rings.

The monooxetane compound applicable for the resin composition for stereolithography of the present invention may include, for example, trimethylene oxide, 3,3-dimethyl oxetane, 3,3-dichloromethyl oxetane, 3-methyl-3-phenoxymethyl oxetane, 3-ethyl-3-(2-ethylhexyloxymethyl)oxetane, and an oxetane monoalcohol compound expressed by the general formula (II) below;

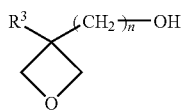

(II)

(wherein $R^3$ denotes an alkyl group having 1 to 5 carbon atoms, an aryl group, or an aralkyl group, and n denotes an integer from 1 to 6).

In the general formula (II), examples of $R^3$ may include alkyl groups such as methyl group, ethyl group, propyl group, butyl group, and pentyl group; aryl groups such as phenyl group and naphthyl group; and aralkyl groups such as benzyl group and phenethyl group. Specific examples of oxetane monoalcohol expressed by the general formula (II) may include 3-hydroxymethyl-3-methyloxetane, 3-hydroxymethyl-3-ethyloxetane, 3-hydroxymethyl-3-n-propyl oxetane, 3-hydroxymethyl-3-n-butyl oxetane, and 3-hydroxymethyl-3-n-pentyl oxetane.

In addition, the polyoxetane compound applicable for the resin composition for stereolithography of the present invention may include a dioxetane compound expressed by the general formula (IV) below;

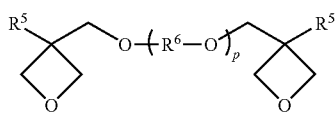

(IV)

(wherein two $R^5$s denote alkyl groups identical to or different from each other having 1 to 5 carbon atoms, $R^6$ denotes a divalent organic group with or without an aromatic ring, and p denotes 0 or 1).

In the general formula (IV) above, examples of $R^5$ may include methyl group, ethyl group, propyl group, butyl group, and pentyl group. In addition, examples of $R^6$ may include straight chain or branched alkylene groups having 1 to 12 carbon atoms (for example, ethylene group, propylene group, butylene group, neopentylene group, n-pentamethylene group, and n-hexamethylene group); divalent groups expressed by a formula: —$CH_2$-Ph-$CH_2$— or —$CH_2$-Ph-Ph-$CH_2$—; cyclohexane dimethanol residue; and tricyclodecane dimethanol residue.

Specific examples of the dioxetane compound expressed by the general formula (IV) may include 1,4-bis[(3-ethyl-3-oxetanylmethoxy)methyl]benzene, 1,4-bis(3-ethyl-3-oxetanylmethoxy)butane, 1,4-bis[(3-methyl-3-oxetanylmethoxy)methyl]cyclohexane, bis(3-methyl-3-oxetanyl methyl)ether, bis(3-ethyl-3-oxetanyl methyl)ether, bis(3-propyl-3-oxetanyl methyl)ether, bis(3-butyl-3-oxetanyl methyl)ether, and 2,2-bis[4-(3-ethyl-3-oxetanylmethoxy)cyclohexyl]propane.

The resin composition for stereolithography of the present invention can contain one or not less than two types of monooxetane compound and polyoxetane compound described above together with oxetane compound (I).

In addition, any compound that develops polymerization reaction and/or crosslinking reaction when active energy rays are radiated in the presence of a radical polymerization initiator may be used for the radical polymerizable organic compound to be contained in the resin composition for stereolithography of the present invention, typically as (meth)acrylate compounds and unsaturated polyester compounds, and one or not less than two types of these ethylenic unsaturated compounds may be used.

Among all, compounds having at least one (meth)acryl group in one molecule are preferably used for the radical polymerizable organic compound, and specific examples may include reaction products of an epoxy compound and (meth)acrylic acid, (meth)acrylic acid ester of alcohols, polyester (meth)acrylate, and polyether (meth)acrylate.

The reaction products of an epoxy compound and (meth)acrylic acid mentioned above applicable for the radical polymerizable organic compound may include epoxy (meth)acrylate reaction products obtained by reaction of (meth)acrylic acid with an aromatic epoxy compound, an alicyclic epoxy compound and/or an aliphatic epoxy compound. Among these, preferably used are epoxy (meth)acrylate reaction products obtained by reaction of (meth)acrylic acid with an aromatic epoxy compound, and specific examples may include epoxy (meth)acrylate obtained by reaction of (meth)acrylic acid with glycidyl ether obtained by reaction of an epoxidizing agent, such as epichlorohydrin, and a bisphenol compound, such as bisphenol A and bisphenol F, or an alkylene oxide adduct thereof, and epoxy (meth)acrylate reaction products obtained by reaction of epoxy novolac resin and (meth)acrylic acid.

In addition, (meth)acrylic acid ester of alcohols mentioned above applicable for the radical polymerizable organic compound may include (meth)acrylate obtained by reaction of (meth)acrylic acid with an aromatic alcohol, an aliphatic alcohol, an alicyclic alcohol, having at least one hydroxyl group in a molecule, and/or an alkylene oxide adduct thereof.

More specifically, for example, it may include 2-ethylhexyl (meth)acrylate, 2-hydroxyethyl (meth)acrylate, 2-hydroxypropyl (meth)acrylate, lauryl (meth)acrylate, stearyl (meth)acrylate, isooctyl (meth)acrylate, tetrahydrofurfuryl (meth)acrylate, isobornyl (meth)acrylate, benzyl (meth)acrylate, 1,4-butanediol di(meth)acrylate, 1,6-hexanediol di(meth)acrylate, diethylene glycol di(meth)acrylate, triethylene glycol di(meth)acrylate, neopentyl glycol di(meth)acrylate, polyethylene glycol di(meth)acrylate, polypropylene glycol di(meth)acrylate, trimethylolpropane tri(meth)acrylate, pentaerythritol tri(meth)acrylate, pentaerythritol tetra(meth)acrylate, dipentaerythritol hexa(meth)acrylate, other dipentaerythritol poly(meth)acrylates, (meth)acrylate of an alkylene oxide adduct of polyol, such as diols, triols, tetraols, and hexaols mentioned above, ethylene oxide modified bisphenol A diacrylate, and propylene oxide modified bisphenol A diacrylate.

Among these, (meth)acrylate having two or more (meth)acryl groups in one molecule obtained by reaction of (meth)acrylic acid with polyol is preferably used for the (meth)acrylate of alcohols, and for example, pentaerythritol tetra (meth)acrylate, ethylene oxide modified pentaerythritol tetra (meth)acrylate, propylene oxide modified pentaerythritol tetra meth)acrylate, and dipentaerythritol poly(meth)acrylate are preferably used.

In addition, among the (meth)acrylate compounds mentioned above, acrylate compounds, rather than methacrylate compounds, are preferably used from the perspective of polymerization speed.

Further, polyester (meth)acrylate mentioned above applicable for the radical polymerizable organic compound may include polyester (meth)acrylate obtained by reaction of (meth)acrylic acid with polyester containing a hydroxyl group.

In addition, abovementioned polyether (meth)acrylate may include polyether acrylate obtained by reaction of acrylic acid with polyether containing a hydroxyl group.

Among these, in the present invention, epoxy acrylate obtained by reaction of acrylic acid with bisphenol A diglycidyl ether (for example, "VR-77" manufactured by Showa Highpolymer Co., Ltd.), isobornyl acrylate, lauryl acrylate, isostearyl acrylate, dipentaerythritol hexaacrylate, dipentaerythritol pentaacrylate, ethylene oxide modified pentaerythritol tetraacrylate, propylene oxide modified pentaerythritol tetraacrylate, and ethylene oxide modified trimethylolpropane triacrylate are preferably used for the radical polymerizable organic compound from the perspective such as reactivity and mechanical properties of a cured product thereof.

In the present invention, as the cationic polymerization initiator, any polymerization initiators may be used that are capable of initiating cationic polymerization of oxetane compound (I) and a cationically polymerizable organic compound other than oxetane compound (I) when active energy rays are radiated. Among these, onium salts releasing Lewis acid upon irradiation of active energy rays are preferably used for the cationic polymerization initiator. Examples of such onium salts may include aromatic sulfonium salts of a group VIIa element, aromatic onium salts of a group VIa element, and aromatic onium salts of a group Va element. More specifically, they may include, for example, triphenylsulfonium hexafluoroantimonate, triphenylphenacylphosphonium tetrafluoroborate, diphenyl[4-(phenylthio)phenyl]sulfonium hexafluoroantimonate, bis[4-(diphenylsulfonio)phenyl]sulfide bisdihexafluoroantimonate, bis[4-(di-4'-hydroxyethoxyphenylsulfonio)phenyl]sulfide bisdihexafluoroantimonate, bis[4-(diphenylsulfonio)phenyl]sulfide bisdihexafluorophosphate, and diphenyliodonium tetrafluoroborate.

In the present invention, one or not less than two types out of the cationic polymerization initiators mentioned above may be used. Among these, in the present invention, aromatic sulfonium salts are more preferably used.

Furthermore, in the present invention, a photosensitizer such as benzophenone, benzoin alkyl ether, and thioxanthone, may be used, as needed, together with a cationic polymerization initiator for the purpose of improving the reaction speed.

In the present invention, any polymerization initiator capable of initiating radical polymerization of a radical polymerizable organic compound when active energy rays are radiated may be used for the radical polymerization initiator, and it may include, for example, benzyl and dialkyl acetal compounds thereof, phenyl ketone compounds, and acetophenone compounds, and benzoin and alkyl ether compounds thereof, benzophenone compounds, and thioxanthone compounds.

Specific examples of such benzyl and dialkyl acetal compounds thereof applicable for the radical polymerization initiator may include benzyl dimethyl ketal and benzyl-β-methoxy ethyl acetal.

Such phenyl ketone compounds may include, for example, 1-hydroxycyclohexyl phenyl ketone.

In addition, such acetophenone compounds may include, for example, diethoxyacetophenone, 2-hydroxymethyl-1-phenylpropane-1-one, 4'-isopropyl-2-hydroxy-2-methylpropiophenone, 2-hydroxy-2-methylpropiophenone, p-dimethylaminoacetophenone, p-tert-butyldichloroacetophenone, p-tert-butyltrichloroacetophenone, and p-azidobenzalacetophenone.

Then, such benzoin and alkyl ether compounds thereof may include, for example, benzoin, benzoin methyl ether, benzoin ethyl ether, benzoin isopropyl ether, benzoin normal butyl ether, and benzoin isobutyl ether.

In addition, such benzophenone compounds may include, for example, benzophenone, methyl o-benzoylbenzoate, Michler's ketone, 4,4'-bisdiethylamino benzophenone, and 4,4'-dichlorobenzophenone.

Then, such thioxanthone compounds may include, for example, thioxanthone, 2-methylthioxanthone, 2-ethylthioxanthone, 2-chlorothioxanthone, and 2-isopropylthioxanthone.

In the present invention, one or not less than two types of radical polymerization initiators mentioned above may be used. Among all, 1-hydroxycyclohexyl phenyl ketone is preferably used for the radical polymerization initiator from the perspective of good hue (such as being less yellow) of a cured product thus obtained.

In a case where the resin composition for stereolithography of the present invention contains oxetane compound (I), a cationically polymerizable organic compound other than oxetane compound (I), and a cationic polymerization initiator, although the content of each component may differ according to type of component, use of fabricated product, and the like, it is generally preferred that, based on the total mass of the resin composition for stereolithography, the content of oxetane compound (I) is from 3 to 60 mass %, particularly from 5 to 40 mass %, the content of a cationically polymerizable organic compound other than oxetane compound (I) is from 10 to 90 mass %, particularly from 20 to 80 mass %, and the content of a cationic polymerization initiator is from 1 to 15 mass %, particularly from 2 to 10 mass % from the perspective of obtaining the effects of the present invention smoothly.

In a case where the resin composition for stereolithography of the present invention contains oxetane compound (I), a cationically polymerizable organic compound other than oxetane compound (I), a radical polymerizable organic compound, a cationic polymerization initiator, and a radical polymerization initiator, although the content of each component may differ according to type of component, use of fabricated product, and the like, it is generally preferred that, based on the total mass of the resin composition for stereolithography, the content of oxetane compound (I) is from 3 to 60 mass %, particularly from 5 to 40 mass %, the content of a cationically polymerizable organic compound other than oxetane compound (I) is from 20 to 70 mass %, particularly from 30 to 65 mass %, the content of a radical polymerizable organic compound is from 5 to 50 mass %, particularly from 10 to 40 mass %, the content of a cationic polymerization initiator is from 1 to 10 mass %, particularly from 2 to 8 mass %, and the content of a radical polymerization initiator is from 1 to 10 mass %, particularly from 2 to 8 mass % from the perspective of obtaining the effects of the present invention smoothly.

In addition, in a case where the resin composition for stereolithography of the present invention contains another oxetane compound other than oxetane compound (I) as a cationically polymerizable organic compound other than oxetane compound (I) (for example, the monooxetane compound and polyoxetane compound mentioned above) together with oxetane compound (I), it is preferred that the content of another oxetane compound is, based on the total mass of the resin composition for stereolithography, from 1 to 60 mass %, particularly from 2 to 40 mass %, from the perspective such as mechanical strength of a cured product thereof.

Moreover, the resin composition for stereolithography of the present invention may optionally contain a polyalkylene ether compound, and in a case of containing a polyalkylene ether compound, the physical properties, such as impact resistance, of a stereolithography product thus obtained are more improved.

Polyalkylene ether compounds particularly expressed by the general formula (V) below;

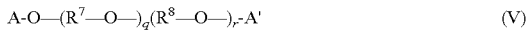

$$A-O-(R^7-O-)_q(R^8-O-)_r-A' \qquad (V)$$

[wherein $R^7$ and $R^8$ denote straight chain or branched alkylene groups different from each other having 2 to 5 carbon atoms, A and A' independently of each other denote a hydrogen atom, an alkyl group having 1 to 5 carbon atoms, a phenyl group, an acetyl group, or a benzoyl group, and q and r independently of each other denote an integer of 0 or 1 or greater (with the proviso that both q and r do not denote 0 at the same time)]
is preferably used for such a polyalkylene ether compound.

In the polyalkylene ether compound expressed by the general formula (V) above [hereinafter may be referred to as "polyalkylene ether compound (V)"], when both q and r are integers of 1 or greater and the sum of q and r is 3 or greater, oxyalkylene units (alkylene ether units): $-R^7-O-$ and oxyalkylene units (alkylene ether units): $-R^8-O-$ may be bonded randomly or in a block form, or may be bonded in a mixed form of random bond and block bond.

In polyalkylene ether compound (V) above, specific examples of $R^7$ and $R^8$ may include ethylene groups, n-propylene group, isopropylene group, n-butylene group (tetramethylene group), isobutylene group, tert-butylene group, and straight chain or branched pentylene group [for example, $-CH_2CH_2CH_2CH_2CH_2-$ and $-CH_2CH_2CH(CH_3)CH_2-$ and the like]. Among these, $R^7$ and $R^8$ are preferably any of ethylene group, n-propylene group, isopropylene group, n-butylene group (tetramethylene group), n-pentylene group, and branched pentylene group expressed by a formula: $-CH_2CH_2CH(CH_3)CH_2-$.

In addition, in polyalkylene ether compound (V) above, specific examples of A and A' may include a hydrogen atom, methyl group, ethyl group, propyl group, butyl group, phenyl group, acetyl group, and benzoyl group, and among these, at least one of A and A' is, particularly both are, preferably a hydrogen atom. In a case of at least one of A and A' being a hydrogen atom, when active energy rays are radiated to the resin composition for stereolithography containing the polyalkylene ether compound for curing, the hydroxyl groups at both ends of the polyalkylene ether compound are reacted with an epoxy compound or a radical polymerization initiator to bring the polyalkylene ether compound to be bonded in the cured resin, and thus the properties such as impact resistance are more improved.

In the polyalkylene ether compound (V) above, q and r indicating a number of oxyalkylene unit repetitions is preferably a number to provide a number average molecular weight of the polyalkylene ether compound within the range from 500 to 10,000, particularly from 500 to 5,000.

Favorable examples of the polyalkylene ether compound (V) above may include polyethylene glycol, polypropylene glycol, polytetramethylene glycol, polyethylene oxide-polypropylene oxide block copolymer, random copolymer of ethylene oxide and propylene oxide, polyether containing oxytetramethylene units, bonded therein, (tetramethylene ether units containing an alkyl substituent group) containing an alkyl substituent group expressed by a formula: $-CH_2CH_2CH(R^9)CH_2O-$ (wherein $R^9$ denotes an alkyl group having 1 to 5 carbon atoms, preferably a methyl or ethyl group), and polyether containing, randomly bonded therein, the above oxytetramethylene units and oxytetramethylene units containing an alkyl substituent group expressed by the formula above: $-CH_2CH_2CH(R^9)CH_2O-$ (wherein $R^9$ denotes an alkyl group having 1 to 5 carbon atoms). One or not less than two types of above polyalkylene ether compounds may be used. Among these, polytetramethylene glycol having a number average molecular weight within the above range from 500 to 10,000, and/or polyether having a number average molecular weight within the above range from 500 to 10,000, containing, randomly bonded therein, the tetramethylene ether units and tetramethylene ether units having alkyl substituent groups expressed by a formula: $-CH_2CH_2CH(R^9)CH_2O-$ (wherein $R^9$ denotes an alkyl group having 1 to 5 carbon atoms) is preferably used, and in this case, a 3-dimensional article can be obtained that has low moisture absorption and is excellent in dimensional stability and stability of physical properties.

In a case of the resin composition for stereolithography of the present invention containing a polyalkylene ether compound, the content of polyalkylene ether compound (V) is, relative to the total mass of the resin composition for stereolithography, preferably from 1 to 30 mass %, and more preferably from 2 to 20 mass %. It may also contain two or more types of polyalkylene ether compounds at the same time to the extent not exceeding the above content.

The resin composition for stereolithography of the present invention may contain, as long as the effects of the present invention are not impaired, an adequate amount of one or not less than two types of, for example, coloring agent, such as pigment and dye, defoamer, leveling agent, thickener, flame retardant, antioxidant, filler (such as crosslinking polymer particles, silica, glass powders, ceramic powders, and metal powders), and modifier resin as needed.

For performing 3-dimensional fabrication optically using the resin composition for stereolithography of the present invention, any conventionally known method and apparatus of stereolithography may be used. A typical example of stereolithography method preferably employed may include a method in which active energy rays are selectively radiated to a resin composition for stereolithography of the present invention in liquid form so as to obtain a cured layer having a desired pattern and thus a cured layer is formed, followed by supplying an uncured liquid resin composition for stereolithography to the cured layer and repeating the laminating operation of similarly radiating active energy rays for newly forming another cured layer subsequent to the cured layer to finally obtain an intended 3-dimensional article.

The active energy rays for such operation may include, as described above, ultraviolet rays, electron rays, X-rays, radioactive rays, and high frequency waves. Among these, ultraviolet rays having a wave length from 300 nm to 400 nm is preferably used from the economical perspective, and in this case, ultraviolet lasers (such as semiconductor excitation solid lasers, Ar lasers, He—Cd lasers), high pressure mercury lamps, super high pressure mercury lamps, low pressure mercury lamps, xenon lamps, halogen lamps, metal halide lamps, ultraviolet LEDs (light emitting diodes), ultraviolet fluorescent lamps, and the like may be used for the light source.

For forming each cured resin layer having a predetermined form and pattern by radiating active energy rays to a fabricating surface made of a resin composition for stereolithography, a cured resin layer may be formed by a stippling or line-drawing system using active energy rays focused into a spot such as laser light, or a lithography system may be employed in which active energy rays are radiated in a sheet-like form to a fabricating surface through a sheet-like print mask formed by aligning a plurality of micro optical shutters such as liquid crystal shutters and digital micromirror shutter devices (DMD) for forming a cured resin layer.

The resin composition for stereolithography of the present invention can be widely applied to the stereolithography fields and is not limited in any form, and typical application fields may include a form verification model for verifying the external design during the design process, a function test model for checking functionality of components, a master model for making a casting mold, a master model for making a die assembly, and a direct die for a prototype die assembly. In particular, the resin composition for stereolithography of the present invention demonstrates outstanding effectiveness in fabricating form verification models and function test models of precision components. More specifically, for example, it can be effectively used for the uses such as for example, models of precision components, electric and electronic components, furniture, building structures, automobile components, various containers, castings and so on, and mother dice, and to-be-processed models.

EXAMPLES

Although the present invention is specifically described below with Examples and the like, the present invention not at all limited to the examples. In the examples below, "parts" indicates parts by mass.

In addition, in the examples below, measurement of viscosity, moisture absorption, cured depth (Dp), critical curing energy (Ec), and operation curing energy ($E_{10}$) of the resin composition for stereolithography (hereinafter, may be referred to as "resin composition for stereolithography"), and measurement or calculation of mechanical properties [tensile properties (tensile break strength, tensile break elongation, and tensile elasticity modulus), yield strength, flexural properties (flexural strength, and flexural elasticity modulus)], volume shrinkage, surface hardness, heat distortion temperature, and moisture absorption (elongation rate under the humidity of 80%) of a fabricated product obtained by stereolithography were carried out in the following manner.

(1) Viscosity of Resin Composition for Stereolithography:

A resin composition for stereolithography was placed in a thermostat at 25° C. to adjust the temperature of the resin composition for stereolithography to 25° C., and then the viscosity was measured with a B-type viscometer (manufactured by Tokyo Keiki Inc.).

(2) Hygroscopicity of Resin Composition for Stereolithography:

One hundred grams of a resin composition for stereolithography produced in each Example and Comparative Example below was placed in a beaker (capacity of 100 ml) and kept in a desiccator (capacity of 5000 ml) conditioned at a humidity of 60% to be left there at a temperature of 25° C. for 14 days, followed by taken out of the desiccator to measure the moisture (water) (mass %) contained in the resin composition for stereolithography using a volumetric titrator for water determination ("Model KF-06" manufactured by Mitsubishi Chemical Corp.).

(3) Cured Depth (Dp), Critical Curing Energy (Ec), and Operation Curing Energy ($E_{10}$) of Resin Composition for Stereolithography:

Measurement was carried out according to the theory described in Non-Patent Document 1. Specifically, laser light (ultraviolet light having a wave length of 355 nm, laser intensity on the liquid surface of 100 mW) of a semiconductor excitation solid laser was radiated to a fabrication surface (liquid surface) made of a resin composition for stereolithography by varying the scanning speed in six levels (varying the amount of irradiation energy in six levels) to form a photocured film. The photocured film thus generated was taken out of the photocuring resin composition liquid and uncured resin was removed to measure the thicknesses of the cured film in the areas corresponding to the six-level energy with constant pressure calipers. The thicknesses of the photocured film were plotted on the Y axis and the amounts of irradiation energy on the X axis (logarithmic axis) to obtain the cured depth [Dp (mm)] from the slope of a straight line obtained by plotting and to determine the critical curing energy [Ec (mJ/cm$^2$)] as the intercept on the X axis and the operable curing energy [($E_{10}$/(mJ/cm$^2$))] as the amount of exposure energy required for curing to a thickness of 0.25 mm.

(4) Tensile Properties of Stereolithography Product (Tensile Break Strength, Tensile Break Elongation, and Tensile Elasticity Modulus):

Using stereolithography products (dumbbell test specimens in conformity with JIS K-7113) fabricated in Examples and Comparative Examples below, the tensile break strength (tensile strength), tensile break elongation (tensile elongation), and tensile elasticity modulus of the test specimens were measured according to JIS K-7113.

(5) Yield Strength of Stereolithography Product:

In the tensile properties test of (3) above, the strength at the transition point of each stereolithography product from elasticity to plasticity was determined as the yield strength.

(6) Flexural Properties of Stereothography Product (Flexural Strength and Flexural Elasticity Modulus):

Using stereolithography products (bar test specimens in conformity with JIS K-7171) fabricated in Examples and Comparative Examples below, flexural strength and flexural elasticity modulus of the test specimens were measured according to JIS K-7171.

(7) Volume Shrinkage:

From a specific gravity ($d_0$) of each resin composition (liquid) for stereolithography before photocuring and a specific gravity ($d_1$) of a cured product obtained by photocuring, the volume shrinkage was obtained by the mathematical expression below.

$$\text{Volume Shrinkage}(\%)=\{(d_1-d_0)/d_1\}\times 100$$

(8) Surface Hardness after Fabrication:

Using stereolithography products (dumbbell test specimens in conformity with JIS K-7113) fabricated in Examples and Comparative Examples below, surface hardness of the test specimens (4 days after producing the stereolithography products) was measured with "Asker D type hardness tester", manufactured by Kobunshi Keiki Co., Ltd., by a durometer method in conformity with JIS K-6253.

(9) Heat Distortion Temperature of Stereolithography Product:

Using stereolithography products (bar test specimens in conformity with JIS K-7171) fabricated in Examples and Comparative Examples below, heat distortion temperature of the test specimens was measured with "HDT Tester 6M-2", manufactured by Toyo Seiki Seisaku-sho Ltd., by applying a load of 1.81 MPa to the test specimens in conformity with JIS K-7207 (A Method).

(10) Moisture Absorption of Stereolithography Product (Elongation Ratio due to Moisture Absorption):

Rectangular strip stereolithography products (length×width×thickness=200 mm×10 mm×1 mm) fabricated in Examples and Comparative Examples below were placed in a desiccator conditioned at a humidity of 80% and left there as they are at a temperature of 25° C. for 14 days, followed by taken out of the desiccator to measure the length, and thus the elongation rate (%) was obtained relative to the length (200 mm) before placed in the desiccator.

Synthesis Example 1

Synthesis of 3-ethyl-3-(4-hydroxybutyl)oxymethyloxetane (1) After adding 465 g (4.0 mol) of 3-ethyl-3-hydroxymethyloxetane, 486 g (4.8 mol) of triethylamine, and 1840 ml of toluene in a glass flask having an internal volume of 5000 ml equipped with a stirrer, a thermometer, and a dropping funnel, 504 g (4.4 mol) of methanesulfonyl chloride was gently added while keeping the liquid temperature from 5° C. to 10° C. to carry out a reaction, while stirring, at the same temperature range for three hours and at room temperature for three hours. After completing the reaction, 930 ml of a saturated aqueous sodium hydrogen carbonate solution (concentration of 9.3 mass %) was added to the reaction solution to separate into a water layer and an organic layer. Then, after extracting the water layer with 930 ml of toluene, the extract was combined with the previous organic layer and washed with 465 ml of water. By concentrating the organic layer thus obtained under reduced pressure, 777 g of 3-ethyl-3-methanesulfonyloxymethyloxetane with a purity of 95 mass % (quantitative value determined by $^1$H-NMR) as a brown liquid was obtained (isolated yield based on 3-ethyl-3-hydroxymethyloxetane=95%).

The characteristic values of 3-ethyl-3-methanesulfonyloxymethyloxetane thus obtained were as below.

CI-MS (m/e), 195 (M+1)

$^1$H-NMR (CDCl$_3$, δ (ppm)): 0.94 (3H, t), 1.81 (2H, q), 3.07 (3H, s), 4.38 (2H, s), 4.42-4.48 (4H, m)

(2) After adding 721 g (8.0 mol) of 1,4-butanediol and 350 ml of toluene in a glass flask having an internal volume of 2000 ml equipped with a stirrer, a thermometer, a dropping funnel, and a reflux condenser and heating up to 60° C. while stirring, 38.7 g (0.12 mol) of tetrabutylammonium bromide and 184 g (4.4 mol) of 96 mass % sodium hydroxide were added and heated up to 75° C. while stirring. Then, 777 g (3.8 mol) of 3-ethyl-3-methanesulfonyloxymethyloxetane with a purity of 95 mass % synthesized in (1) above was gently dropped while keeping the liquid temperature from 75° C. to 85° C. to carry out a reaction at the same temperature range for two hours. After completing the reaction, 800 ml of water was added to the reaction solution [a bisoxetane ether compound was generated as little as 7% (value analyzed by gas chromatography)] to separate into a water layer and an organic layer. The organic layer thus obtained was added with 800 ml of toluene and 400 ml of water, and by adding acetic acid while stirring, the pH was adjusted to 9.5. Then, after separating into a water layer and an organic layer, the water layer was extracted twice with 400 ml of toluene, the extract (toluene liquid) was mixed with the previous organic layer and concentrated under reduced pressure. By distilling the concentrate thus obtained under reduced pressure (from 157° C. to 159° C., 1.9 kPa), 497 g of 3-ethyl-3-(4-hydroxybutyl)oxymethyloxetane with a purity of 96% (value analyzed by gas chromatography) as a colorless liquid was obtained (isolated yield based on 3-ethyl-3-methanesulfonyloxymethyloxetane=67%).

The characteristic values of 3-ethyl-3-(4-hydroxybutyl)oxymethyl-oxetane thus obtained were as below.

CT-MS (m/e): 189 (M+1)

$^1$H-NMR (CDCl$_3$, δ (ppm)): 0.88 (3H, t, J=7.5), 1.58-1.68 (4H, m), 1.74 (2H, q, J=7.5), 3.47-3.60 (7H, m), 4.34 (2H, d, J=5.8), 4.44 (2H, d, J=5.8)

Synthesis Example 2

Synthesis of 3-ethyl-3-(5-hydroxypentyl)oxymethyloxetane (1) By an operation similar to (1) of Synthesis Example 1, 324 g (1.5 mol) of 3-ethyl-3-methanesulfonyl oxymethyloxetane with a purity of 90 mass % (quantitative value determined by $^1$H-NMR) was obtained.

(2) In a glass flask having an internal volume of 2000 ml equipped with a stirrer, a thermometer, a dropping funnel, and a reflux condenser, 1171 g (11.2 mol) of 1,5-pentanediol, 24.1 g (75 mmol) of tetrabutylammonium bromide, and 90 g (2.2 mol) of 96 mass % sodium hydroxide were added and heated up to 70° C. while stirring. Then, 324 g (1.5 mol) of 3-ethyl-3-methanesulfonyl oxymethyloxetane with a purity of 90 mass % synthesized in (1) above was gently dropped while keeping the liquid temperature from 75° C. to 85° C. to carry out a reaction at the same temperature range for three hours. After completing the reaction, the reaction solution was washed with 200 ml of heptane, followed by adding 583 ml of water to separate into a water layer and an organic layer. The organic layer thus obtained was added with 1166 ml of water and 500 ml of toluene to separate into a water layer and an organic layer. Then, the water layer was added with 500 ml of toluene for extraction, and the extract (toluene liquid) was mixed with the previous organic layer, followed by washing with 300 ml of water to separate into a water layer and an organic layer. This water layer was mixed with the previously separated water layer and extracted with 500 ml of toluene to separate into a water layer and a toluene layer (extract), followed by washing the toluene layer with water and mixing the toluene layer after washing with the previous organic layer to concentrate under reduced pressure. In the concentrate thus obtained, a bisoxetane ether compound was generated as little as 14% (value analyzed by gas chromatography). By distilling this concentrate under reduced pressure (from 136° C. to 140° C., 533 Pa), 109 g of 3-ethyl-3-(5-hydroxypentyl)oxymethyloxetane with a purity of 93% (value analyzed by gas chromatography) as a colorless liquid was obtained (isolated yield based on 3-ethyl-3-methanesulfonyloxymethyloxetane=33%).

The characteristic values of 3-ethyl-3-(5-hydroxypentyl) oxymethyloxetane thus obtained were as below.

CI-MS (m/e): 203 (M+1)

$^1$H-NMR (CDCl$_3$, δ (ppm)): 0.88 (3H, t, J=7.5), 1.38-1.67 (6H, m), 1.74 (2H, q, J=7.5), 1.8 (1H, brs), 3.47 (2H, t, J=6.4), 3.52 (2H, s), 3.63 (2H, t, J=6.4), 4.34 (2H, d, J=5.8), 4.44 (2H, d, J=5.8)

Synthesis Example 3

Synthesis of 3-ethyl-3-(3-hydroxypropyl)oxymethyloxetane (1) By an operation similar to (1) of Synthesis Example 1, 324 g (1.5 mol) of 3-ethyl-3-methanesulfonyl oxymethyloxetane with a purity of 90 mass % (quantitative value determined by $^1$H-NMR) was obtained.

(2) In a glass flask having an internal volume of 2000 ml equipped with a stirrer, a thermometer, a dropping funnel, and a reflux condenser, 285 g (3.7 mol) of 1,3-propanediol, 12.1 g (37.5 mmol) of tetrabutylammonium bromide, 72 g (2.2 mol) of 96 mass % sodium hydroxide, and 150 ml of toluene were added and heated up to 80° C. while stirring. Then, 324 g (1.5 mol) of 3-ethyl-3-methanesulfonyloxymethyloxetane with a purity of 90 mass % synthesized in (1) above was gently dropped while keeping the liquid temperature from 80° C. to 90° C. to carry out a reaction at the same temperature range for two hours. After completing the reaction, the reaction solution (a bisoxetane ether compound was generated as little as 7%; value analyzed by gas chromatography) was added with 300 ml of water to separate into a water layer and an organic layer. The water layer thus obtained was extracted with 200 ml of toluene, and the extract (toluene layer) was mixed with the previous organic layer to concentrate under reduced pressure. By distilling the concentrate thus obtained under reduced pressure (from 135° C. to 137° C., 1.1 kPa), 152 g of 3-ethyl-3-(3-hydroxypropyl)oxymethyl-oxetane with a purity of 97% (value analyzed by gas chromatography) as a colorless liquid was obtained (isolated yield based on 3-ethyl-3-methanesulfonyloxymethyloxetane=56%).

The characteristic values of 3-ethyl-3-(3-hydroxypropyl) oxymethyl-oxetane thus obtained were as below.

CI-MS (m/e): 175 (M+1)

$^1$H-NMR (CDCl$_3$, δ (ppm)): 0.89 (3H, t, J=7.5), 1.73 (2H, q, J=7.5), 1.82-1.89 (2H, m), 2.37 (1H, t, J=5.5), 3.57 (2H, s), 3.66 (2H, t, J=5.6), 3.77 (2H, q, J=5.6), 4.39 (2H, d, J=5.9), 4.40 (2H, d, J=5.9)<

Example 1

(1) By thoroughly mixing 15 parts of 3,4-epoxycyclohexylmethyl-3',4'-epoxycyclohexane carboxylate, 40 parts of hydrogenated bisphenol A diglycidyl ether, 10 parts of 3-ethyl-3-(4-hydroxybutyl)oxymethyloxetane obtained in Synthesis Example 1, 10 parts of ethylene oxide modified bisphenol A diacrylate ("NK Ester A-BPE-4" manufactured by Shin-nakamura Chemical Co., Ltd.), 10 parts of dipentaerythritol polyacrylate ("NK Ester A-9530" manufactured by Shin-nakamura Chemical Co., Ltd.), 5 parts of copolymerized tetramethylene ether glycol ("PTXG 1800" manufactured by Asahi Kasei Corp.), 3 parts of a triaryl sulfonium hexafluoroantimonate cationic polymerization initiator ("CPT-101 A" manufactured by SAN-APRO Ltd.), and 2 parts of a radical polymerization initiator (1-hydroxy-cyclohexyl phenyl ketone; "IRGACURE 184" manufactured by Ciba Specialty Chemicals Inc.) at room temperature, a resin composition for stereolithography was prepared.

The viscosity and moisture absorption of this resin composition for stereolithography were measured by the methods described above, and the results were as shown in Table 1 below.

(2) The cured depth (Dp), critical curing energy (Ec), and operation curing energy ($E_{10}$) of the resin composition for stereolithography obtained in (1) above were measured by the method described above, and the results were as shown in Table 1 below.

(3) The resin composition for stereolithography obtained in (1) above was subjected to stereolithography of 0.10 mm of slice pitch (lamination thickness) for two minutes of average fabrication time per layer, using an ultra fast stereolithography system ("SOLIFORM 500B" manufactured by Nabtesco Corp.) with a semiconductor laser (nominal power 1000 mW; wave length 355 nm; "semiconductor excitation solid laser BL6" manufactured by Spectra-Physics Lasers, Inc.) under the conditions of 500 mW at liquid surface and 80 mJ/cm$^2$ of liquid surface irradiation energy to fabricate, for measuring the physical properties, dumbbell test specimens in conformity with JIS K-7113, bar test specimens in conformity with JIS K-7171, and a rectangular strip fabricated product and measure the physical properties by the methods described above. The results are shown in Table 1 below.

Example 2

(1) A resin composition for stereolithography was prepared in the same manner as (1) of Example 1 except using 10 parts of 3-ethyl-3-(5-hydroxypentyl)oxymethyl-oxetane obtained in Synthesis Example 2, instead of 10 parts of 3-ethyl-3-(4-hydroxybutyl)oxymethyl-oxetane obtained in Synthesis Example 1 used in (1) of Example 1 as an oxetane compound. The viscosity and moisture absorption of this resin composition for stereolithography were measured by the methods described above, and the results were as shown in Table 1 below.

(2) The cured depth (Dp), critical curing energy (Ec), and operation curing energy ($E_{10}$) of the resin composition for stereolithography obtained in (1) above were measured by the method described above, and the results were as shown in Table 1 below.

(3) The resin composition for stereolithography obtained in (1) above was subjected to stereolithography in the same manner as (3) of Example 1 to fabricate, for measuring the physical properties, dumbbell test specimens in conformity with JIS K-7113, bar test specimens in conformity with JIS K-7171, and a rectangular strip fabricated product and measure the physical properties by the methods described above. The results are shown in Table 1 below.

Example 3

(1) A resin composition for stereolithography was prepared in the same manner as (1) of Example 1 except using 10 parts of 3-ethyl-3-(3-hydroxypropyl)oxymethyloxetane obtained in Synthesis Example 3, instead of 10 parts of 3-ethyl-3-(4-hydroxybutyl)oxymethyloxetane obtained in Synthesis Example 1 used in (1) of Example 1 as an oxetane compound. The viscosity and moisture absorption of this resin composition for stereolithography were measured by the methods described above, and the results were as shown in Table 1 below.

(2) The cured depth (Dp), critical curing energy (Ec), and operation curing energy ($E_{10}$) of the resin composition for stereolithography obtained in (1) above were measured by the method described above, and the results were as shown in Table 1 below.

(3) The resin composition for stereolithography obtained in (1) above was subjected to stereolithography in the same manner as (3) of Example 1 to fabricate, for measuring the physical properties, dumbbell test specimens in conformity with JIS K-7113, bar test specimens in conformity with JIS K-7171, and a rectangular strip fabricated product and measure the physical properties by the methods described above. The results are shown in Table 1 below.

Example 4

(1) A resin composition for stereolithography was prepared in the same manner as (1) of Example 1 except using 5 parts of 3-ethyl-3-(4-hydroxybutyl)oxymethyloxetane obtained in Synthesis Example 1 and 5 parts of bis(3-ethyl-3-oxetanylmethyl)ether ("OXT-221" manufactured by Toagosei Co., Ltd.), instead of 10 parts of 3-ethyl-3-(4-hydroxybutyl) oxymethyloxetane obtained in Synthesis Example 1 used in (1) of Example 1 as an oxetane compound. The viscosity and moisture absorption of this resin composition for stereolithography were measured by the methods described above, and the results were as shown in Table 1 below.

(2) The cured depth (Dp), critical curing energy (Ec), and operation curing energy ($E_{10}$) of the resin composition for stereolithography obtained in (1) above were measured by the method described above, and the results were as shown in Table 1 below.

(3) The resin composition for stereolithography obtained in (1) above was subjected to stereolithography in the same manner as (3) of Example 1 to fabricate, for measuring the physical properties, dumbbell test specimens in conformity with JIS K-7113, bar test specimens in conformity with JIS K-7171, and a rectangular strip fabricated product and measure the physical properties by the methods described above. The results are shown in Table 1 below.

Comparative Example 1

(1) A resin composition for stereolithography was prepared in the same manner as (1) of Example 1 except using 10 parts of 3-ethyl-3-hydroxymethyloxetane ("OXT-101" manufactured by Toagosei Co., Ltd.), instead of 10 parts of 3-ethyl-3-(4-hydroxybutyl)oxymethyloxetane obtained in Synthesis Example 1 used in (1) of Example 1 as an oxetane compound. The viscosity and moisture absorption of this resin composition for stereolithography were measured by the methods described above, and the results were as shown in Table 1 below.

(2) The cured depth (Dp), critical curing energy (Ec), and operation curing energy ($E_{10}$) of the resin composition for stereolithography obtained in (1) above were measured by the method described above, and the results were as shown in Table 1 below.

(3) The resin composition for stereolithography obtained in (1) above was subjected to stereolithography in the same manner as (3) of Example 1 to fabricate, for measuring the physical properties, dumbbell test specimens in conformity with JIS K-7113, bar test specimens in conformity with JIS K-7171, and a rectangular strip fabricated product and measure the physical properties by the methods described above. The results are shown in Table 1 below.

|  | Example 1 | Example 2 | Example 3 | Example 4 | Comparative example 1 |
|---|---|---|---|---|---|
| [Physical Properties of Resin Composition] | | | | | |
| Viscositiy (mPa · s) | 380 | 390 | 370 | 365 | 360 |
| Moisture Absorption (mass %) | 0.76 | 0.78 | 0.81 | 0.74 | 1.20 |
| Cured Depth (Dp) (mm) | 0.15 | 0.16 | 0.15 | 0.14 | 0.15 |
| Critical Curing Energy (Ec) (mJ/cm$^2$) | 15 | 15 | 16 | 18 | 15 |
| Operation Curing Energy ($E_{10}$) (mJ/cm$^2$) | 77 | 75 | 76 | 76 | 74 |
| [Physical Properties of Stereolithography Product] | | | | | |
| Tensile Break Strength (MPa) | 40 | 42 | 39 | 39 | 41 |
| Tensile Break Elongation (%) | 15 | 18 | 14 | 12 | 8 |
| Tensile Elasticity Modulus (MPa) | 1600 | 1550 | 1650 | 1780 | 1700 |
| Yield Strength (MPa) | 43 | 46 | 43 | 43 | 45 |
| Flexural Strength (MPa) | 43 | 42 | 40 | 40 | 45 |
| Flexural Elasticity Modulus (MPa) | 1700 | 1700 | 1750 | 1870 | 1800 |
| Volume Shrinkage (%) | 5.3 | 5.3 | 5.2 | 5.3 | 5.4 |
| Surface Hardness (Shore D hardness) | 81 | 81 | 82 | 82 | 81 |
| Heat Distortion Temperature (° C.) | 46 | 45 | 47 | 48 | 46 |
| Elongation Ratio under 80% of Humidity (%)[1] | 0.31 | 0.39 | 0.32 | 0.35 | 0.94 |

[1] Elongation Ratio after Leaving for 14 Days at 80% of Humidity and 25° C. of Temperature As shown in Table 1 above, the resin compositions for stereolithography of Examples 1 through 4 containing oxetane compounds included in oxetane compound (I) have remarkably low moisture absorption rates and absorbed extremely little water and moisture over time before curing compared with the resin composition for stereolithography of Comparative Example 1 containing an oxetane compound other than oxetane compound (I) (3-ethyl-3-hydroxymethyl oxetane).

Moreover, the stereolithography products obtained from the resin compositions for stereolithography of Examples 1 through 4 have remarkably low elongation rates when left for 14 days under the condition of 80% of humidity compared with the stereolithography product obtained from the resin composition for stereolithography of Comparative Example 1, and are excellent in dimensional stability over time.

Example 5

(1) By thoroughly mixing 140 parts of 3,4-epoxycyclohexylmethyl-3',4'-epoxycyclohexane carboxylate, 50 parts of ethylene oxide modified bisphenol A diacrylate ("NK Ester A-BPE-4" manufactured by Shin-nakamura Chemical Co., Ltd.), 30 parts of ethylene oxide modified pentaerythritol tetraacrylate ("ATM-4E" manufactured by Shin-nakamura Chemical Co., Ltd.), 30 parts of diacrylate of dicyclopentadiene ("A-DCP" manufactured by Shin-nakamura Chemical Co., Ltd.), 30 parts of 3-ethyl-3-(4-hydroxybutyl)oxymethyloxetane manufactured by carrying out the same operation as Synthesis Example 1, 10 parts of copolymerized tetramethylene ether glycol ("PTXG 1800" manufactured by Asahi Kasei Corp.), 10 parts of a triarylsulfonium hexafluoroantimonate cationic polymerization initiator ("CPI-101 A" manufactured by SAN-APRO Ltd.), and 10 parts of a radical polymerization initiator (1-hydroxycyclohexyl phenyl ketone; "IRGACURE 184" manufactured by Ciba Specialty Chemicals Inc.) at room temperature, a resin composition for stereolithography was prepared.

The viscosity and moisture absorption of this resin composition for stereolithography were measured by the methods described above, and the results were as shown in Table 2 below.

(2) The cured depth (Dp), critical curing energy (Ec), and operation curing energy ($E_{10}$) of the resin composition for stereolithography obtained in (1) above were measured by the method described above, and the results were as shown in Table 2 below.

(3) The resin composition for stereolithography obtained in (1) above was subjected to stereolithography in the same manner as (3) of Example 1 to fabricate, for measuring the physical properties, dumbbell test specimens in conformity with JIS K-7113, bar test specimens in conformity with JIS K-7171, and a rectangular strip lithographed product and measure the physical properties by the methods described above. The results are shown in Table 2 below.

Comparative Example 2

(1) A resin composition for stereolithography was prepared in the same manner as (1) of Example 5 except using 30 parts of 3-ethyl-3-hydroxymethyloxetane ("OXT-101" manufactured by Toagosei Co., Ltd.), instead of 30 parts of 3-ethyl-3-(4-hydroxybutyl)oxymethyloxetane used in (1) of Example 5 as an oxetane compound. The viscosity and moisture absorption of this resin composition for stereolithography were measured by the methods described above, and the results were as shown in Table 2 below.

(2) The cured depth (Dp), critical curing energy (Ec), and operation curing energy ($E_{10}$) of the resin composition for stereolithography obtained in (1) above were measured by the method described above, and the results were as shown in Table 2 below.

(3) The resin composition for stereolithography obtained in (1) above was subjected to stereolithography in the same manner as (3) of Example 1 to fabricate, for measuring the physical properties, dumbbell test specimens in conformity with JIS K-7113, bar test specimens in conformity with JIS K-7171, and a rectangular strip fabricated product and measure the physical properties by the methods described above. The results are shown in Table 2 below.

Example 6

(1) By thoroughly mixing 30 parts of 3,4-epoxycyclohexylmethyl-3',4'-epoxycyclohexane carboxylate, 60 parts of hydrogenated bisphenol A diglycidyl ether, 50 parts of ethylene oxide modified bisphenol A diacrylate ("NK Ester A-BPE-4" manufactured by Shin-nakamura Chemical Co., Ltd.), 30 parts of ethylene oxide modified pentaerythritol tetraacrylate ("ATM-4E" manufactured by Shin-nakamura Chemical Co., Ltd.), 30 parts of diacrylate of dicyclopentadiene ("A-DCP" manufactured by Shin-nakamura Chemical Co., Ltd.), 80 parts of 3-ethyl-3-(4-hydroxybutyl)oxymethyloxetane manufactured by carrying out the same operation as Synthesis Example 1, 10 parts of copolymerized tetramethylene ether glycol ("PTXG 1800" manufactured by Asahi Kasei Corp.), 10 parts of a triaryl sulfonium hexafluoroantimonate cationic polymerization initiator ("CPI-101 A" manufactured by SAN-APRO Ltd.), and 10 parts of a radical polymerization initiator (1-hydroxy-cyclohexyl phenyl ketone; "IRGACURE 184" manufactured by Ciba Specialty Chemicals Inc.) at room temperature, a resin composition for stereolithography was prepared.

The viscosity and moisture absorption of this resin composition for stereolithography were measured by the methods described above, and the results were as shown in Table 2 below.

(2) The cured depth (Dp), critical curing energy (Ec), and operable curing energy ($E_{10}$) of the resin composition for stereolithography obtained in (1) above were measured by the method described above, and the results were as shown in Table 2 below.

(3) The resin composition for stereolithography obtained in (1) above was subjected to stereolithography in the same manner as (3) of Example 1 to fabricate, for measuring the physical properties, dumbbell test specimens in conformity with JIS K-7113, bar test specimens in conformity with JIS K-7171, and a rectangular strip fabricated product and measure the physical properties by the methods described above. The results are shown in Table 2 below.

Comparative Example 3

(1) A resin composition for stereolithography was prepared in the same manner as (1) of Example 6 except using 80 parts of 3-ethyl-3-hydroxymethyloxetane ("OXT-101" manufactured by Toagosei Co., Ltd.), instead of 80 parts of 3-ethyl-3-(4-hydroxybutyl)oxymethyloxetane used in (1) of Example 6 as an oxetane compound. The viscosity and moisture absorption of this resin composition for stereolithography were measured by the methods described above, and the results were as shown in Table 2 below.

(2) The cured depth (Dp), critical curing energy (Ec), and operation curing energy ($E_{10}$) of the resin composition for stereolithography obtained in (1) above were measured by the method described above, and the results were as shown in Table 2 below.

(3) The resin composition for stereolithography obtained in (1) above was subjected to stereolithography in the same manner as (3) of Example 1 to fabricate, for measuring the physical properties, dumbbell test specimens in conformity with JIS K-7113, bar test specimens in conformity with JIS K-7171, and a rectangular strip fabricated product and measure the physical properties by the methods described above. The results are shown in Table 2 below.

|  | Example 5 | Comparative example 2 | Example 6 | Comparative example 3 |
|---|---|---|---|---|
| [Physical Properties of Resin Composition] | | | | |
| Viscositiy (mPa · s) | 380 | 365 | 390 | 365 |
| Moisture Absorption (mass %) | 0.88 | 1.20 | 0.85 | 1.50 |
| Cured Depth (Dp) (mm) | 0.15 | 0.14 | 0.16 | 0.15 |
| Critical Curing Energy (Ec) (mJ/cm$^2$) | 15 | 15 | 15 | 14 |
| Operation Curing Energy ($E_{10}$) (mJ/cm$^2$) | 77 | 76 | 75 | 74 |

| | Example 5 | Comparative example 2 | Example 6 | Comparative example 3 |
|---|---|---|---|---|
| [Physical Properties of Stereolithography Product] | | | | |
| Tensile Break Strength (MPa) | 40 | 39 | 33 | 31 |
| Tensile Break Elongation (%) | 10 | 11 | 25 | 18 |
| Tensile Elasticity Modulus (MPa) | 1780 | 1720 | 1400 | 1380 |
| Yield Strength (MPa) | 43 | 46 | 43 | 45 |
| Flexural Strength (MPa) | 60 | 61 | 38 | 35 |
| Flexural Elasticity Modulus (MPa) | 2200 | 2120 | 1380 | 1350 |
| Volume Shrinkage (%) | 5.3 | 5.3 | 5.3 | 5.3 |
| Surface Hardness (Shore D hardness) | 82 | 82 | 80 | 80 |
| Heat Distortion Temperature (° C.) | 50 | 49 | 45 | 46 |
| Elongation Ratio under 80% of Humidity (%)[1] | 0.68 | 1.0 | 0.51 | 0.92 |

[1]Elongation Ratio after Leaving for 14 Days at 80% of Humidity and 25° C. of Temperature As shown in Table 2 above, the resin compositions for stereolithography of Examples 5 and 6 containing a oxetane compound included in oxetane compound (I) [3-ethyl-3-(4-hydroxybutyl)oxymethyloxetane] have remarkably low moisture absorption rates and absorbed extremely little water and moisture over time before curing compared with the resin compositions for stereolithography of Comparative Examples 2 and 3 containing an oxetane compound other than oxetane compound (I) (3-ethyl-3-hydroxymethyloxetane).

Moreover, the stereolithography products obtained from the resin compositions for stereolithography of Examples 5 and 6 have remarkably low elongation rates when left for 14 days under the condition of 80% of humidity compared with the stereolithography products obtained from the resin compositions for stereolithography of Comparative Examples 2 and 3, and are excellent in dimensional stability over time.

INDUSTRIAL APPLICABILITY

The resin composition for stereolithography of the present invention absorbs extremely little water and moisture over time in uncured state, can maintain a low moisture absorption rate even when kept under high humidity, has stable physical and curing properties, is excellent in handling property, and moreover, has high curing sensitivity for active energy rays, and thereby, a stereolithography product thereof excellent in the properties, such as dimensional stability, mechanical properties, and water resistance, can be produced smoothly and productively in high resolution and with high fabrication accuracy for reduced active energy ray irradiation time.

Therefore, using the resin composition for stereolithography of the present invention, models and to be processed models for precision components, electric and electronic components, furniture, building structures, automobile components, various containers, castings, die assemblies, mother dice, and the like, components for designing complex heat transfer circuits, components for analyzing and designing heat transfer behavior of complex structure, and various 3-dimensional articles having other complex forms and/or structures can be fabricated.

The invention claimed is:
1. A resin composition for stereolithography, comprising an oxetane compound expressed by formula (I):

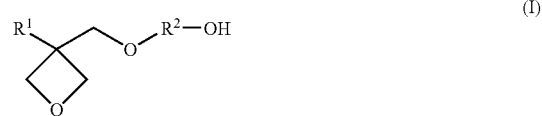

wherein $R^1$ denotes an alkyl group having 1 to 5 carbon atoms, and $R^2$ denotes an alkylene group having 2 to 10 carbon atoms that may contain an ether bond, in the proportion of from 3 to 60 mass % based on the total mass of the resin composition for stereolithography, a cationically polymerizable organic compound other than the oxetane compound expressed by the general formula (I), an active energy ray sensitive cationic polymerization initiator, a radical polymerizable organic compound, and an active energy ray sensitive radical polymerization initiator;
wherein based on the total mass of the resin composition for stereolithography, a content of the cationically polymerizable organic compound other than the oxetane compound expressed by the general formula (I) is from 20 to 70 mass %, a content of the radical polymerizable organic compound is from 5 to 50 mass %, a content of the active energy ray sensitive cationic polymerization initiator is from 1 to 10 mass %, and a content of the active energy ray sensitive radical polymerization initiator is from 1 to 10 mass %;
wherein the cationically polymerizable organic compound other than the oxetane compound expressed by formula (I) comprises an epoxy compound; and
the radical polymerizable organic compound comprises an ethylenic unsaturated compound.
2. The resin composition for stereolithography of claim 1, comprising an oxetane compound other than the oxetane compound expressed by the general formula (I).
3. A resin composition for stereolithography of claim 1, wherein the oxetane compound expressed by formula (I) is at least one selected from the group consisting of 3-ethyl-3-(4-hydroxybutyl)oxymethyl-oxetane, 3-ethyl-3-(5-hydroxypentyl)oxymethyl-oxetane, and 3-ethyl-3-(3-hydroxy-n-propyl)oxymethyl-oxetane.
4. The resin composition for stereolithography of claim 3, comprising an oxetane compound other than the oxetane compound expressed by the general formula (I).

* * * * *